United States Patent [19]

Wang et al.

[11] Patent Number: 5,216,684
[45] Date of Patent: Jun. 1, 1993

[54] RELIABLE AlInGaAs/AlGaAs STRAINED-LAYER DIODE LASERS

[75] Inventors: Christine A. Wang, Bedford; James N. Walpole; Hong K. Choi, both of Concord; Joseph P. Donnelly, Carlisle, all of Mass.

[73] Assignee: Massachusetts Institute of Technology, Cambridge, Mass.

[21] Appl. No.: 579,347

[22] Filed: Sep. 7, 1990

[51] Int. Cl.$^5$ .............................................. H01S 3/19
[52] U.S. Cl. .................................................. 372/45
[58] Field of Search ................... 372/45, 44; 352/16, 352/17, 61

[56] References Cited

U.S. PATENT DOCUMENTS 4,710,940 12/1987 Sipes ..................................... 372/75
4,841,531 6/1989 Kondoa et al. ........................ 372/45

OTHER PUBLICATIONS

"Long-lived InGaAs Quantum Well Lasers", Fischer et al., Applied Physics Letters, 54, 1861 (1989).
"Viable Strained-Layer Laser at λ=1000nm", Waters et al., Journal of Applied Physics, 67, 1132 (1990).
"Dependence of Threshold Current Density on Quantum Well Composition for Strained-Layer InGaAs-GaAs Lasers by Metalorganic Chemical Vapor Deposition", App. Phy. Ltrs., 55, 2585 (1989).
"InGaAs/AlGaAs Strained Single Quantum Well Diode Lasers with Extremely Low Threshold Current Density and HIgh Efficiency", Choi et al., Applied Physics Letters, 57, 321 (1990).
"Low Degradation Rate in Strained InGaAs/AlGaAs Single Quantum Lasers", Bour et al., Bour et al., Photonics Technology Letters, 2, 173 (1990).
"Inhibited Dark-Line Defect Formation in Strained InGaAs/AlGaAs Quantum Well Lasers", Waters et al., IEEE Photonics Letters, 2, 531 (1990).
"Large-Area Uniform MOVPE Growth for GaAs/AlGaAs Quantum-Well Diode Lasers with Controlled Emission Wavelength", Wang et al., Journal of Electronic Materials, 18, 695 (1989).
"GaInAs/AlGaInAs DH and MQW Lasers with 1.5-1.7 μm Lasing Wavelengths Grown by Atomspheric Pressure MOVPE", Gessner et al., Electronics Letters, 25, 516 (1989).
"New Current Injection 1.5-μm Wavelength $Ga_x$-$Al_yIn_{1-x-y}$/InP Double-Heterostructure Laser Grown by Molecular Beam Epitaxy", Tsang et al., Applied Physics Letters, 42, 922 (1983).
"AlGaInAs/InP Double Heterostructure Lasers Grown by Low-Pressure Metal Organic Vapor-Phase Epitaxy for Emission at 1300nm", Davies et al., Electronics Letters, 24, 732 (1988).

Primary Examiner—James W. Davie
Attorney, Agent, or Firm—Choate, Hall & Stewart

[57] ABSTRACT

A strained quantum-well diode laser with an AlInGaAs active layer and AlGaAs cladding and/or confining layers on a GaAs substrate is provided. AlInGaAs/AlGaAs lasers can be configured in laser geometries including ridge, waveguide, buried heterostructure, oxide-defined, proton-defined, narrow-stripe, broad-stripe, coupled-stripe and linear arrays using any epitaxial growth technique. Broad-stripe devices were fabricated in graded-index separate confinement heterostructures, grown by organometallic vapor phase epitaxy on GaAs substrates, containing a single $Al_yIn_xGa_{1-x-y}As$ quantum well with x between 0.14 and 0.12 and y between 0.05 and 0.17. With increasing Al content, emission wavelengths from 890 to 785 nm were obtained. Threshold current densities, $J_{th}$'s, less than 200 A cm$^{-2}$ and differential quantum efficiencies in the range 71 to 88 percent were observed.

41 Claims, 3 Drawing Sheets

RELIABLE AlINGAAS/ALGAAS STRAINED-LAYER DIODE LASERS

The United States Government has rights to this invention based upon funding by the Department of the Air Force Grant Number F19628-90-C002.

BACKGROUND OF THE INVENTION

The invention relates to AlInGaAs/AlGaAs diode lasers.

Semiconductor diode lasers characterized by darkline defect growth resistance and capable of laser emission in a wavelength range 0.65–0.95 μm are desired. Alloy systems can be designed to yield active layer/cladding layer structures with these desired performance characteristics.

SUMMARY OF THE INVENTION

AlInGaAs/AlGaAs lasers with a strained $Al_yIn_xGa_{1-x-y}As$ quantum-well active layer and $Al_yGa_{1-y}As$ confining layers on a GaAs substrate can be used in place of conventional lasers with a lattice-matched, unstrained GaAs or AlGaAs active layer. Furthermore, In incorporation extends the laser emission wavelength to an approximately 1.1 μm long wavelength emission limit, as compared with the approximately 0.87 μm GaAs/AlGaAs emission limit. Partial replacement of Ga in $In_xGa_{1-x}As$ by Al to yield the quaternary alloy $Al_yIn_xGa_{1-x-y}As$ increases the electron transition energy, shortening emission wavelengths, while providing reliability enhancement. Also, lower threshold current densities, $J_{th}$'s, and improved reliability are observed in devices with active layers having sufficient indium content.

In one aspect of the invention, a semiconductor diode laser including a substrate, an AlInGaAs alloy active layer, AlGaAs confining layers, and contact layers is provided.

In various embodiments of the invention, the AlInGaAs layer is strained and it may have a composition $Al_yIn_xGa_{1-x-y}As$ wherein $0.02 \leq x = 0.40$ and $0 \leq y \leq 0.85$. In one embodiment, $0.12 \leq x \leq 0.14$ and $0.05 \leq y \leq 0.17$. The alloy composition can be adjusted so that the laser emits in the range 650 to 950 nm with a critical threshold current density less than 200 A/cm² and differential quantum efficiency in the range 71 to 88 percent. In one embodiment, the semiconductor diode laser is a broad stripe laser fabricated using organometallic vapor phase epitaxy and standard photolithographic techniques. In other embodiments, the laser can be a ridge, waveguide, buried heterostructure, oxide-defined, proton-defined, narrow-stripe, coupled-stripe or linear array laser.

In another aspect of the invention, a semiconductor diode laser consists of a substrate, GaAs buffer layer, first AlGaAs layer, first AlGaAs cladding layer, first AlGaAs confining layer, AlInGaAs active layer, second AlGaAs confining layer, second AlGaAs cladding layer, second AlGaAs layer and heavily doped GaAs contact layer.

In preferred embodiments, the substrate can be GaAs which can be doped or semi-insulating. The GaAs buffer layer, first and second AlGaAs layers, and first and second AlGaAs cladding layers can be n- or p-doped. The first or second AlGaAs confining layers can be undoped.

In preferred embodiments, the first and second AlGaAs layer and AlGaAs confining layers can have a constant, step graded or linearly graded composition of $Al_yGa_{1-y}As$ with y between 0.1 and 0.7 and $Al_yGa_{1-y}As$ with y between 0.3 and 0.7, respectively. The first AlGaAs layer has the composition $Al_yGa_{1-y}As$ with y linearly graded from 0.1 to 0.7, the first AlGaAs cladding layer has the composition $Al_{0.7}Ga_{0.3}As$, the undoped AlGaAs confining layers have the composition $Al_yGa_{1-y}As$ with y graded from 0.7 to 0.3, the second AlGaAs cladding layer has the composition $Al_{0.7}Ga_{0.3}As$, the second AlGaAs layer has the composition $Al_yGa_{1-y}As$ with y linearly graded from 0.7 to 0.1. In preferred embodiments, p- and n-type doping is in the range $10^{18}$ to $10^{17}$ cm$^{-3}$ and heavy doping exceeds $10^{19}$ cm$^{-3}$.

According to another aspect of the invention, a growth method for AlInGaAs/AlGaAs semiconductor diode lasers includes growth of a GaAs buffer layer, followed by growth of a first AlGaAs cladding layer, first AlGaAs graded-index layer, AlInGaAs active layer, second AlGaAs graded-index layer, second AlGaAs cladding layer and heavily doped GaAs contact layer.

In various preferred embodiments, the growth temperature of the AlInGaAs active layer is carefully selected to maintain the stability of that indium containing layer. In a preferred embodiment, the active layer is grown at a temperature in the range 650° to 700° C.

Other preferred embodiments provide specific growth temperatures for the layers of the laser structure. The buffer layer and first AlGaAs cladding layer can be grown at a temperature in the range 650° to 800° C. The AlGaAs graded-index layer can be grown as temperature is lowered from a temperature in the range 800° to 650° C. to a temperature in the range 650° to 750° C. over a period of several minutes. Furthermore, the growth rate of this graded-index layer can be reduced to minimize exposure of the layer to an arsine ambient. The graded layer reduced growth rate can be in the range approximately 15 to 60 nm/min. The second graded-index layer can be grown at a temperature in the range 650° to 800° C. The growth rate of the second graded-index layer can be selected to allow temperature to increase sufficiently so that it is in the range 700°–800° C. before growth of higher Al content sections of the graded layer. The second AlGaAs cladding layer is grown at a temperature in the range 650° to 800° C. at a rate in the range 30 to 100 nm/min. The heavily doped GaAs layer is grown at a temperature 550°–700° C. at a rate in the range 15 to 60 nm/min to enhance dopant, such as zinc, incorporation.

DESCRIPTION OF THE PREFERRED EMBODIMENT

Greater reliability for lasers emitting at wavelengths below 0.95 μm is achieved using strained $Al_yIn_xGa_{1-x-y}As$ active layers, in which the Ga content with reference to that of $In_xGa_{1-x}As$ is partially replaced by Al to increase the electron transition energy. Graded-index separate-confinement heterostructure single-quantum-well (GRIN-SCH SQW) $Al_yIn_xGa_{1-x-y}As$/AlGaAs diode lasers with $0.12 \leq x \leq 0.14$ and $0.05 < y < 0.17$ have been fabricated. Laser emission wavelength increases from 785 to 890 nm with decreasing Al content. $J_{th}$ is generally less than 200 A/cm$^2$, while the differential quantum efficiency, $\eta_d$, ranges from 71 to 88 percent.

Figure 1:
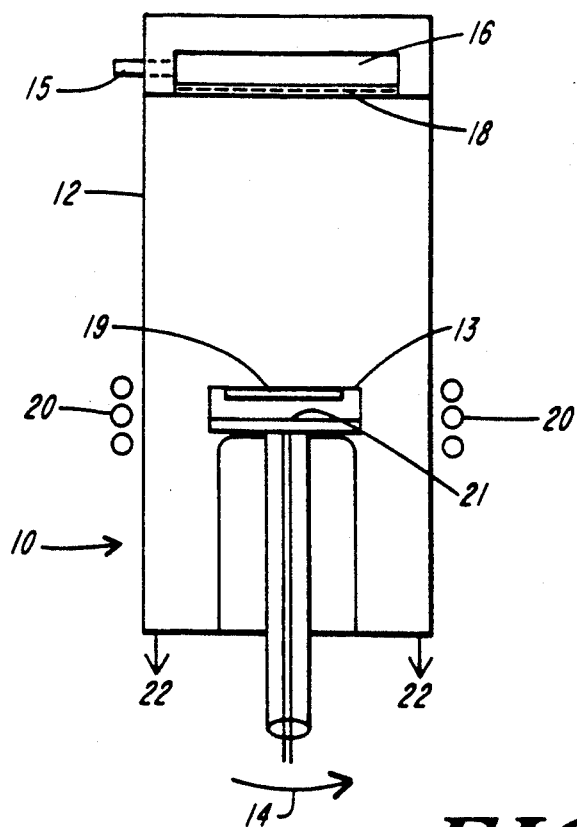
FIG. 1 is a drawing of an organometallic vapor phase epitaxy reactor.

The AlInGaAs/AlGaAs laser structures were grown by organometallic vapor phase epitaxy in a vertical rotating-disk reactor 10 operated at low pressure shown in FIG. 1. It consists of a vertical quartz tube 12 and molybdenum susceptor 13 that can be rotated to 1000 rpm as indicated by arrow 14. Carrier and source gases are injected through inlet 15 radial with respect to tube 12 axis into antechamber 16 at the top of the reactor. Antechamber 16 of approximate volume 100 cm$^3$, produces turbulent flow for complete mixing of component gases. Gas flows through stainless steel mesh 18, to insure uniform laminar flow into the reactor tube. After passing susceptor 13 and substrate 19 heated by rf coils 20, gas exits the reactor through exhaust ports 180° apart indicated by arrows 22. An N$_2$-purged glove box not shown is installed at the top of the reactor for substrate loading and unloading to avoid water and oxygen contamination.

The reactor gas manifold not shown and antechamber 16 are constructed entirely of stainless steel. Mass flow controllers and valves not shown have computer controlled sequencing to insure reproducibility. Gases are introduced with a vent-run system equipped with a low-dead-space, fast-switching gas manifold, which is crucial for making abrupt compositional transitions. Compositional transients during gas switching operations are eliminated by controlling differential pressure between the vent and run lines to ±0.1 Torr. Natural convective flows and hydrodynamic dispersion are minimized by growing material at a reduced pressure of 0.2 atm with a flow rate of 10 slpm. The average gas residence time in the reactor is less than 1 s.

Si-doped n$^+$- GaAs (100) wafers, tilted 2° toward the nearest (110) plane, with etch pit densities of less than 2000 cm$^{-2}$ were used as substrates. Source materials were trimethylgallium, trimethylaluminum, trimethylindium, having concentrations in the range of $2 \times 10^{-6}$ to $2 \times 10^{-4}$ mole fraction and 100 percent arsine having a concentration in the range $10^{-4}$ to $10^{-2}$ mole fraction. Hydrogen selenide (500 ppm in H$_2$) and dimethylzinc (3000 ppm in H$_2$) were used as n- and p-type dopants, respectively.

Figure 2:
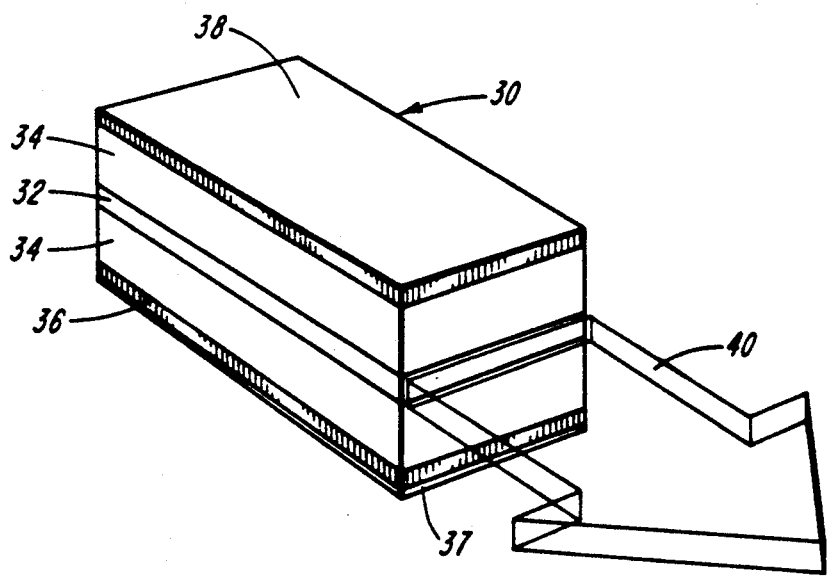
FIG. 2 is a schematic representation of an AlInGaAs/AlGaAs semiconductor diode laser.

FIG. 2 shows an AlInGaAs/AlGaAs double heterojunction diode laser structure 30 consisting of an AlInGaAs active layer 32 surrounded by two lower refractive index AlGaAs cladding layers 34. AlInGaAs active layer 32 can be in a range 50 to 400 Å and preferably in the range 70 to 200 Å thick and AlGaAs cladding layers 34 can be in the range 0.5 to 2.5 μm, depending on the aluminum content, and preferably in the range 1 to 2 μm thick. A lower n-doped contact layer 36 on substrate 37 and upper P-doped contact 38 both have thicknesses in the range 10 nm to 2 μm and preferably in the range 10 nm to 0.5 μm. Arrow 40 indicates emitted laser light.

Figure 3:
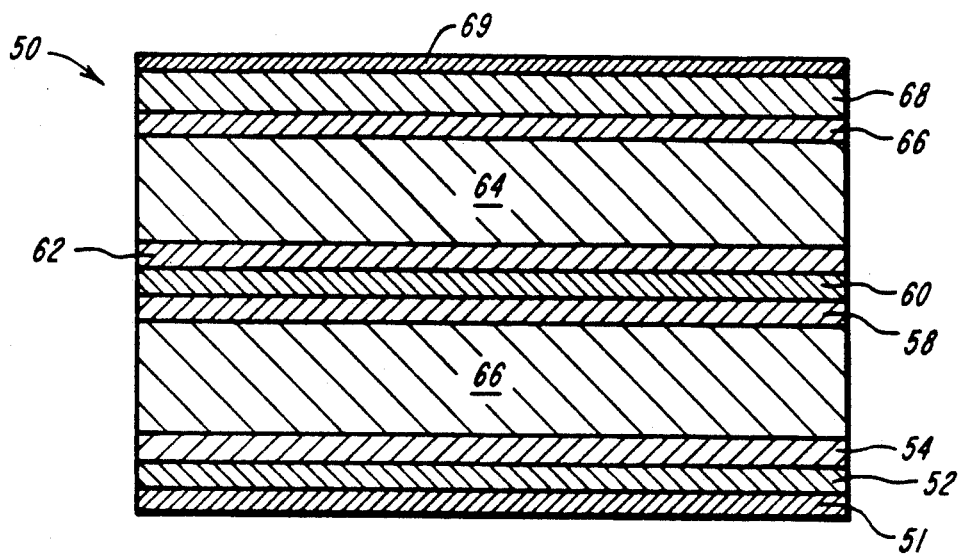
FIG. 3 is a schematic representation of a stripe AlInGaAs/AlGaAs semiconductor diode laser.

FIG. 3 shows a stripe AlInGaAs/AlGaAs semiconductor diode laser structure 50. Structure 50 consists of substrate 51, n-doped GaAs buffer layer 52, graded n-doped $Al_yGa_{1-y}As$ layer 54 with y linearly graded from 0.1 to 0.7, n-doped $Al_{0.7}Ga_{0.3}As$ cladding layer 54, undoped $Al_yGa_{1-y}As$ confining layer 58 with y linearly graded from 0.7 to 0.3, $Al_yIn_xGa_{1-x-y}As$ active layer 60, undoped $Al_yGa_{1-y}As$ confining layer 62 with y linearly graded from 0.3 to 0.7, p-doped $Al_{0.7}Ga_{0.3}As$ cladding layer 64, p-doped $Al_yGa_{1-y}As$ layer 66 with y linearly graded from 0.7 to 0.1, heavily p-doped GaAs contact layer 68 and Ti/Au stripe 69 defined on GaAs cap 68.

Buffer layer 52 can be 20 nm thick and can be in a range 0 to 2 μm and preferably 10 nm to 1 μm. N-doped $Al_yGa_{1-y}As$ graded layer 54 is 0.1 μm thick in a preferred embodiment and can be in the range 10 nm to 0.5 μm and preferably 0.1 to 0.2 μm. In a preferred embodiment, cladding layer 56 is 1.1 μm thick, confining layer 58 is 0.15 μm thick, $Al_yIn_xGa_{1-x-y}As$ active layer 60 is 10 nm thick, confining layer 62 is 0.15 μm thick, cladding layer 64 is 1.1 μm thick. P-doped, linearly graded layer 66 is 0.1 μn thick in a preferred embodiment and can be in the range 10 nm to 0.5 μm, and preferably 0.1 μm to 0.2 μm. Contact layer 68 is 0.1 μm thick in a preferred embodiment and can be in the range 0.1 to 0.5 μm. N- and p-doping levels in cladding layers were varied from $10^{18}$ down to $10^{17}$cm$^{-3}$ toward the GRIN layers to reduce optical loss resulting from free carrier absorption.

Broad-stripe lasers were fabricated with 100 or 200 μm-wide Ti/Au stripes 69 on 400 μm centers defined on GaAs cap layer 68 by means of evaporation and photolithographic liftoff. Mesas were wet chemical etched between stripes to a depth of 1 μm, slightly above the active layer. The wafer was mechanically thinned from the substrate side to 100 μm, and Ge/Au/Ni/Au contacts were alloyed to the substrate at 390° C. For stripe widths of 100 and 200 μm, the wafer was cleaved into bars 500 and 700 μm long, respectively. The lasers were probe tested using 200 ns pulses at 1 kHz. Single-ended optical output power was measured with a calibrated Si photodiode detector.

Figure 4:
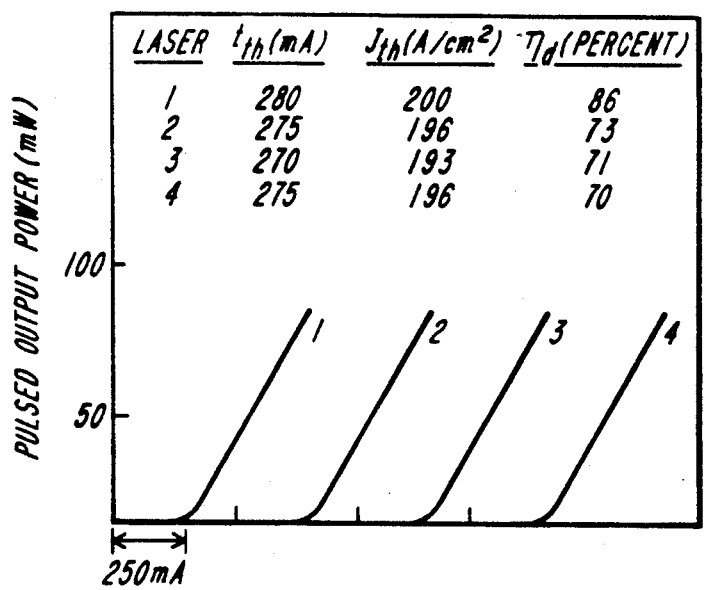
FIG. 4 is a graph of light output versus current for pulsed room-temperature operation of $Al_{0.17}In_{0.12}Ga_{0.71}As$/AlGaAs 200 μm wide, 700 μm long cavity strained single-quantum-well diode lasers.
Figure 5:
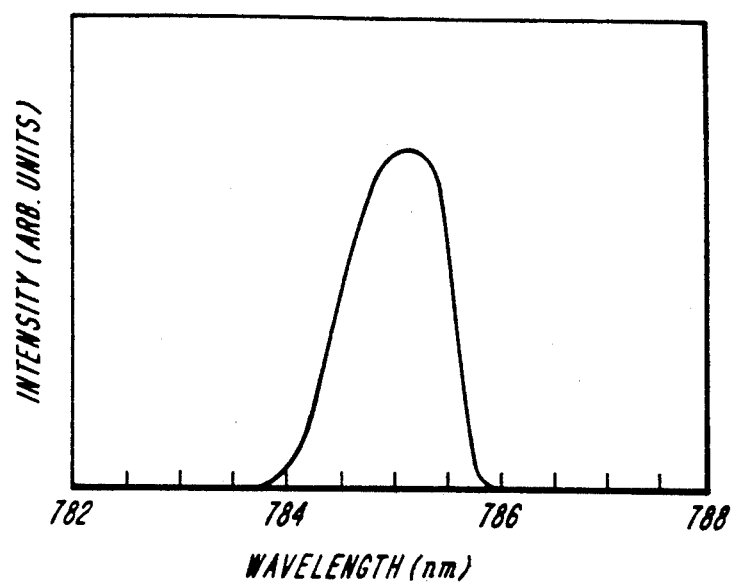
FIG. 5 shows an emission spectrum from an $Al_{0.17}In_{0.12}Ga_{0.71}As$/AlGaAs strained single-quantum-well diode laser under pulsed room-temperature operation at 2 A, 3.7 times threshold current.

FIG. 4 shows light output versus current results for four lasers with 700 μm cavity lengths fabricated from a wafer with an active layer composition with y=0.17 and x=0.12. Values of $J_{th}$ range from 193 to 200A/cm$^2$, and $\eta_d$ varies from 66 to 73 percent. A typical emission spectrum from one such laser measured at 2 A, 3.7 times threshold current is shown in FIG. 5. The peak wavelength is 785 nm.

Table 1 summarizes the performance of lasers fabricated from five $Al_yIn_xGa_{1-x-y}As$/AlGaAs wafers, which have active layer compositions with $0.12 \leq x \leq 0.14$ and y decreasing from 0.17 to 0.05. As expected, the emission wavelength increases with decreasing Al content, from 785 to 890 nm. Except for wafer 847, for which $J_{th}$ appears to be anomalously high, $J_{th}$ ranges from 164 to 196 A/cm$^2$, and $\eta_d$ ranges from 71 to 88 percent. These results compare favorably with those known in the art for $Al_{0.07}Ga_{0.93}As$/AlGaAs lasers emitting at 808 nm.

TABLE 1

Characteristics of $Al_yIn_xGa_{1-x-y}As/AlGaAs$ Diode Lasers

| Wafer | y | x | Cavity length (m) | Wavelength (nm) | $J_{th}$ (A/cm2) | $\eta_d$ (percent) |
|---|---|---|---|---|---|---|
| 809 | 0.17 | 0.12 | 700 | 785 | 193 | 73 |
| 847 | 0.15 | 0.12 | 700 | 815 | 271 | 71 |
| 848 | 0.13 | 0.12 | 700 | 827 | 196 | 74 |
| 849 | 0.09 | 0.13 | 500 | 850 | 192 | 86 |
| 851 | 0.05 | 0.14 | 500 | 890 | 164 | 88 |

A preliminary reliability test was performed on an uncoated 200 μm wide with a 700 μm length cavity broad-area laser, with an $Al_{0.17}In_{0.12}Ga_{0.71}As$ active layer selected at random. This device was fabricated without exercising any precautions to minimize damage. For testing, the device was mounted junction side up and operated cw at a constant current of 225 mA at ambient temperature. After twenty hours of operation, output power decreased by twenty-eight percent from an initial power output level of 70 mW/facet; however, $J_{th}$ increased by only 3.5% from 143 to 148 $Acm^{-2}$.

Substrate temperature is a key parameter in successful OMVPE growth of AlGaAs and AlInGaAs layers. The AlGaAs layers are grown at 800° C. to obtain smooth surface morphology and high optical quality. With decreasing Al content (to pure GaAs), the growth temperature can be lowered to about 700° C. with minimal degradation in optical quality. The InGaAs layers are typically grown at 640° C., to avoid instability at high temperature. With the addition of Al to InGaAs in the quaternary active layer, the growth temperature can be increased to 700° C.

The following sequence was followed in growing the laser structure shown in FIG. 3. GaAs buffer layer 52 and lower AlGaAs cladding layer 56 were grown at 800° C. at a growth rate of 65 nm/min. Temperature was lowered to 700° C. over a period of several minutes, for growth of AlGaAs graded-index layer 58. The growth rate of layer 58 was reduced to approximately 30 nm/min in order to minimize layer exposure to an arsine ambient during temperature reduction and stabilization. Arsine exposure may result in interfacial impurities that create interface traps, recombination centers, etc. AlInGaAs active layer 60 was grown at 700° C. Temperature was raised to 800° C. for AlGaAs graded-index layer 62 growth at a rate of approximately 30 nm/min, to allow the temperature to increase sufficiently before growth of higher Al content AlGaAs layer sections. Upper AlGaAs cladding layer 64 was grown at 800° C. at a growth rate of 65 nm/min. Finally, heavily p-doped GaAs contact layer 68 ($p = 6 \times 10^{19} cm^{-3}$) was grown at 625° C. to enhance Zn incorporation. Substrate temperatures used for OMVPE growth were selected on the basis of surface morphology and photoluminescence studies performed on test layers.

What is claimed is:

1. A semiconducting diode laser comprising:
   a GaAs substrate; and
   an AlInGaAs alloy active layer positioned between AlGaAs confining layers; said active layer and said confining layers further positioned between GaAs contact layers so as to form a contact/confining-/active/confining/contact multilayer structure, said multilayer structure secured to the substrate through one of the contact layers.

2. The laser of claim 1 wherein said AlInGaAs active layer is strained.

3. The laser of claim 1 further comprising additional cladding layers.

4. The laser of claim 1 wherein said AlInGaAs alloy has a composition $Al_yIn_xGa_{1-x-y}As$ wherein $0.02 \leq x \leq 0.40$ and $0.0 < y < 0.85$.

5. The laser of claim 1 wherein said laser emits radiation having a wavelength in the range of 650 to 950 nm.

6. The laser of claim 1 wherein said laser has a critical threshold current density less than 200 $A/cm^2$.

7. The laser of claim 1 wherein said laser has a differential quantum efficiency in the range 71 to 88 percent.

8. A semiconductor diode laser comprising:
   a substrate;
   a GaAs buffer layer;
   a first AlGaAs layer;
   a first AlGaAs cladding layer;
   a first AlGaAs confining layer;
   an AlInGaAs active layer;
   a second AlGaAs confining layer;
   a second AlGaAs cladding layer;
   a second AlGaAs layer; and
   a heavily doped GaAs contact layer.

9. The laser of claim 8 wherein said first AlGaAs layer is n-doped.

10. The laser of claim 8 wherein said first AlGaAs cladding layer is n-doped.

11. The laser of claim 8 wherein said AlGaAs confining layers are undoped.

12. The laser of claim 8 wherein said second AlGaAs cladding layer is p-doped.

13. The laser of claim 8 wherein said second AlGaAs layer is p-doped.

14. The laser of claim 8 wherein said heavily doped GaAs contact layer is p-doped.

15. The laser of claim 8 wherein said first AlGaAs layer is p-doped.

16. The laser of claim 8 wherein said first AlGaAs cladding layer is p-doped.

17. The laser of claim 8 wherein said second AlGaAs cladding layer is n-doped.

18. The laser of claim 8 wherein said second AlGaAs layer is n-doped.

19. The laser of claim 8 wherein said heavily doped contact layer is n-doped.

20. The laser of claim 8 wherein said GaAs buffer layer is n-doped.

21. The laser of claim 8 wherein said GaAs buffer layer is p-doped.

22. The laser of claim 1 or 8 wherein said laser is grown using an epitaxial technique.

23. The laser of claim 22 wherein said epitaxial technique is selected from the group consisting of molecular beam epitaxy (MBE), gas source molecular beam epitaxy (GSMBE), chemical beam epitaxy (CBE), metalloranic molecular beam epitaxy (MOMBE), organometallic vapor phase epitaxy (OMVPE), and liquid phase epitaxy (LPE).

24. The laser of claim 1 or 8 wherein said laser is selected from the group consisting of a ridge, waveguide, buried heterostructure, oxide-defined, proton-defined, broad stripe geometry, narrow stripe geometry, coupled stripe geometry, and linear array laser.

25. The laser of claim 1 or 8 wherein said laser is fabricated using standard photolithographic techniques.

26. The laser of claim 1 or 8 wherein said substrate is GaAs.

27. The substrate of claim 26 wherein said GaAs is semi-insulating.

28. The substrate of claim 26 wherein said GaAs is doped.

29. The laser of claim 8 wherein said first AlGaAs layer has a graded composition.

30. The laser of claim 29 wherein said first AlGaAs layer has the composition $Al_yGa_{1-y}As$ with y linearly graded from 0.1 to 0.7.

31. The laser of claim 8 wherein said first AlGaAs layer has a composition $Al_yGa_{1-y}As$ with y in the range 0.1 to 0.7.

32. The laser of claim 8 wherein said first AlGaAs cladding layer has the composition $Al_{0.7}Ga_{0.3}As$.

33. The laser of claim 8 wherein said AlGaAs confining layer has a graded composition.

34. The laser of claim 33 wherein said AlGaAs confining layer has the composition $Al_yGa_{1-y}As$ with y graded from 0.7 to 0.3.

35. The laser of claim 8 wherein said AlGaAs confining layer has the composition $Al_yGa_{1-y}As$ with y in the range 0.3 to 0.7.

36. The laser of claim 8 wherein said second AlGaAs cladding layer has the composition $Al_{0.7}Ga_{0.3}As$.

37. The laser of claim 8 wherein said second AlGaAs layer has a graded composition.

38. The laser of claim 37 wherein said second AlGaAs layer has the composition $Al_yGa_{1-y}As$ with y linearly graded from 0.7 to 0.1.

39. The laser any of claims 9, 10, 12, 13, 15, 16, 17, 18, 20, or 21 wherein said doping is in the range $10^{17}$ to $10^{18}$ $cm^{-3}$.

40. The laser of claim 14 or 19 wherein the doping of said heavily doped contact layer exceeds $10^{19}$ $cm^{-3}$.

41. The laser of claim 28 wherein said doping is in the range $10^{17}$ to $10^{18}$ $cm^{-3}$.

* * * * *